(12) United States Patent
Zimmermann (10) Patent No.: US 6,580,734 B1
(45) Date of Patent: Jun. 17, 2003

(54) LASER WAVELENGTH STABILIZATION

(75) Inventor: Micha Zimmermann, Haifa (IL)

(73) Assignee: Cyoptics Ltd., Yokneam Illit (IL)

( * ) Notice: Subject to any disclaimer, the term of this patent is extended or adjusted under 35 U.S.C. 154(b) by 55 days.

(21) Appl. No.: 09/786,667

(22) PCT Filed: Jul. 6, 2000

(86) PCT No.: PCT/IL00/00401

§ 371 (c)(1),
(2), (4) Date: Jun. 14, 2001

(87) PCT Pub. No.: WO01/04999

PCT Pub. Date: Jan. 18, 2001

Related U.S. Application Data (60) Provisional application No. 60/142,677, filed on Jul. 7, 1999.

(51) Int. Cl.[7] ............................................. H01S 3/13
(52) U.S. Cl. ............................. 372/29.02; 372/29.011; 372/29.023; 372/32; 372/34; 372/38.01; 372/38.02
(58) Field of Search ........................ 372/32, 34, 36, 372/29.023, 28, 38.01, 38.02, 20, 29.011, 29.02; 385/37

(56) References Cited

U.S. PATENT DOCUMENTS

| | | | | |
|---|---|---|---|---|
| 3,649,930 A | * | 3/1972 | Le Floch | 372/32 |
| 4,503,541 A | * | 3/1985 | Weller et al. | 372/32 |
| 4,779,279 A | * | 10/1988 | Brown | 372/32 |
| 4,786,132 A | | 11/1988 | Gordon | 350/96.19 |
| 5,007,062 A | | 4/1991 | Chesnoy | 372/26 |
| 5,040,183 A | | 8/1991 | Chen et al. | 372/25 |
| 5,077,816 A | | 12/1991 | Glomb et al. | 385/37 |
| 5,181,213 A | | 1/1993 | Shinokura et al. | 372/30 |
| 5,305,336 A | | 4/1994 | Adar et al. | 372/18 |
| 5,586,138 A | | 12/1996 | Yokoyama | 372/97 |
| 5,706,301 A | | 1/1998 | Lagerstrom | 372/32 |
| 5,790,579 A | | 8/1998 | Lee et al. | 372/45 |
| 5,870,417 A | | 2/1999 | Verdiell et al. | 372/32 |
| 5,914,972 A | | 6/1999 | Siala et al. | 372/33 |
| 6,084,893 A | * | 7/2000 | Choi et al. | 372/32 |
| 6,434,176 B1 | * | 8/2002 | Deck | 372/32 |

FOREIGN PATENT DOCUMENTS

| | | |
|---|---|---|
| EP | 949729 A2 | 10/1999 |
| JP | 7015083 A | 1/1995 |
| JP | 7193329 A | 7/1995 |
| JP | 7307512 A | 11/1995 |
| JP | 8321652 A | 12/1996 |
| JP | 11145554 A | 5/1999 |
| WO | WO 99/39411 | 8/1999 |

OTHER PUBLICATIONS

D.J. Derickson et al., "Short Pulse Generation Using Multisegment Mode–Locked Semiconductor Lasers", *IEEE Journal of Quantum Electronics* 28(10), Oct. 1992, pp. 2186–2202.

(List continued on next page.)

*Primary Examiner*—Albert W. Paladini
(74) *Attorney, Agent, or Firm*—Ladas & Parry (57) ABSTRACT

Apparatus for stabilizing an output wavelength of a laser assembly (80), including a plurality of optical elements (88, 92, 97, 96) coupled together so as to form a laser cavity resonating in a single mode dependent upon an optical length of the cavity, and an optical length changer (86) which varies an optical length of at least one of the optical elements so as to vary accordingly the optical length of the cavity. The apparatus further includes a detector (91) which monitors the output of the laser assembly responsive to the variation in the optical length of the at least one of the optical elements. There is also included a stabilizer (93) which responsive to the measured output from the detector supplies a control signal to the optical length changer to control an optical length of at least one of the optical elements, so that the cavity resonates stably at the output wavelength in the single mode.

33 Claims, 9 Drawing Sheets

OTHER PUBLICATIONS

P.B. Hansen et al, "5.5–mm Long InGaAsP Monolithic Extended–Cavity Laser with an Integrated Bragg–Reflector for Active Mode–Locking", *IEEE Photonics Technology Letters* 4(3), Mar. 1992, pp. 215–217.

J.–P. Elbers et al., "3.2 Tbit/s (80× 40 Gbit/s) BiDirectional DWDM/ETDM Transmission", Siemens AG, Germany, PD2–5, ECOC 1999, pp. 32–33.

Y.K. Chen et al., "Monolithic Colliding–Pulse Mode–Locked Quantum–Well Lasers", *IEEE Journal of Quantum Electronics* 28(10), Oct. 1992, pp. 2176–2185.

U.S. Application No. 09/767,204, entitled High Repetition Rate Optical Pulse Generator, filed Jan. 22, 2001.

D.M. Bird et al., "Narrow Line Semiconductor Laser Using Fibre Grating", *Electronic Letters* 27(13), Jun. 20 1991, pp. 1115–1116.

P.A. Morton et al., "Package Hybrid Soliton Pulse Source Results and 270 Terabit.km/sec Soliton Transmission", *IEEE Photonics Technology Letters* 7(1), Jan. 1995, pp. 111–113.

P.A. Morton et al., "Hybrid Soliton Pulse Source with Fibre External Cavity and Bragg Reflector", *Electronic Letters* 28(6), Mar. 12, 1992, pp. 561–562.

* cited by examiner

LASER WAVELENGTH STABILIZATION

CROSS-REFERENCE TO RELATED APPLICATIONS

This application claims the benefit of U.S. Provisional Application 60/142,677, filed Jul. 7, 1999, which is assigned to the assignee of the present patent application and is incorporated herein by reference.

FIELD OF THE INVENTION

The present invention relates generally to lasers, and specifically to stabilization of lasers operating in a single mode.

BACKGROUND OF THE INVENTION

Figure 1:
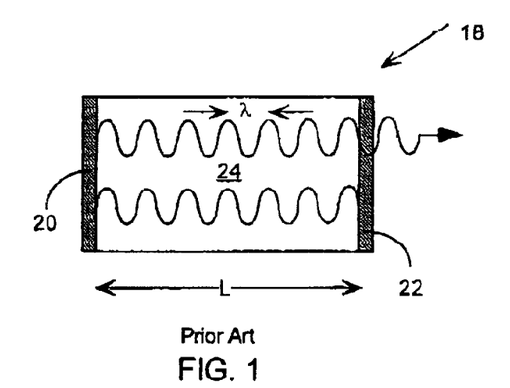
FIG. 1 is a schematic diagram showing operation of a lasing system, as is known in the art.

FIG. 1 is a schematic diagram showing operation of a lasing system 18, as is known in the art. System 18 comprises two mirrors 20 and 22 separated by a distance L. In order for system 18 to laser i.e., to resonate, at a wavelength $\lambda$, a medium 24 between mirrors 20 and 22 must provide gain, and an effective optical path length $L_{\mathit{eff}}$ between the mirrors must be an integral number of half-wavelengths. Quantitatively, $$L_{\mathit{eff}} = nL \quad (1a)$$

so that $$m \cdot \lambda/2 = nL \quad (1b)$$

or $$f = m \cdot c/(2nL) \quad (1c)$$

wherein m is a positive integer, n is a refractive index of medium 24, f is the frequency corresponding to the wavelength $\lambda$, and c is the speed of light.

From equation (1c), a separation $\Delta f$ of lasing frequencies is given by $$\Delta f = c/(2nL) \quad (2)$$

Each such lasing frequency corresponds to a longitudinal cavity mode. Since $f = c/\lambda$, $\Delta f \approx \lambda - c \cdot \Delta\lambda/\lambda^2$ so that equation (2) can be rewritten to give a separation $\Delta\lambda$ of lasing wavelengths:

$$\Delta\lambda \approx \lambda^2/(2nL) \quad (3)$$

Figure 2:
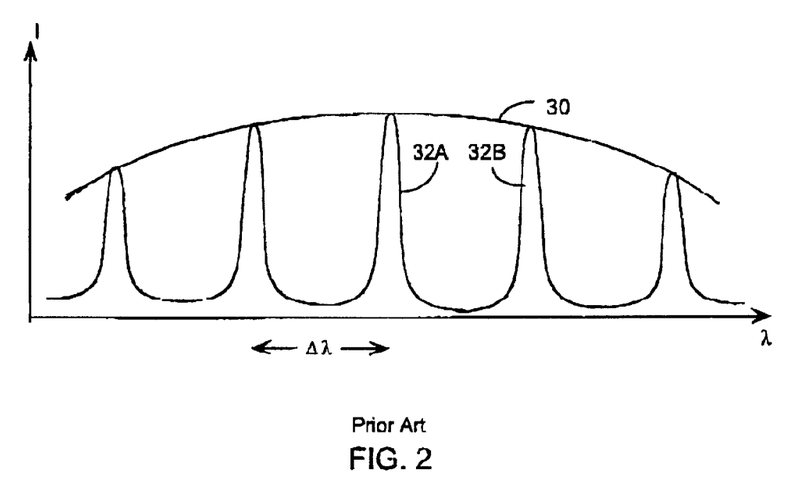
FIG. 2 is a graph of intensity vs. wavelength, illustrating cavity modes for the system of FIG. 1, as is known in the art.

FIG. 2 is a graph of intensity I vs. wavelength $\lambda$ illustrating cavity modes for system 18, as is known in the art. A curve 30 represents an overall gain of medium 74 in system 18. Peaks 32A and 32B, with separation $\Delta\lambda$, show the cavity modes present in system 18, each node corresponding to a different value of m. As is evident from FIG. 2, there are many possible cavity modes for system 1X.

Optical communications within fiber optic links require that the laser carrier have as small a frequency spread as possible, particularly when multiple wavelengths are to be multiplexed on a single fiber. Thus, for efficient communication only one cavity mode should be used, and optimally the frequency spread within the mode should be minimized. Typically, methods for stabilizing the frequency of the laser include utilizing distributed feedback (DFB) lasers and/or distributed Bragg reflectors (DBR). DFB lasers have a frequency-selection grating built into the laser chip, the grating being physically congruent with the gain medium. The grating in a DBR laser is external to the gain medium. The gratings in DFB and DBR lasers are part of the semiconductor material, which is unstable, DFB and DBR lasers were therefore typically externally stabilized utilizing an external wavelength reference in order to achieve good stability.

Figure 3:
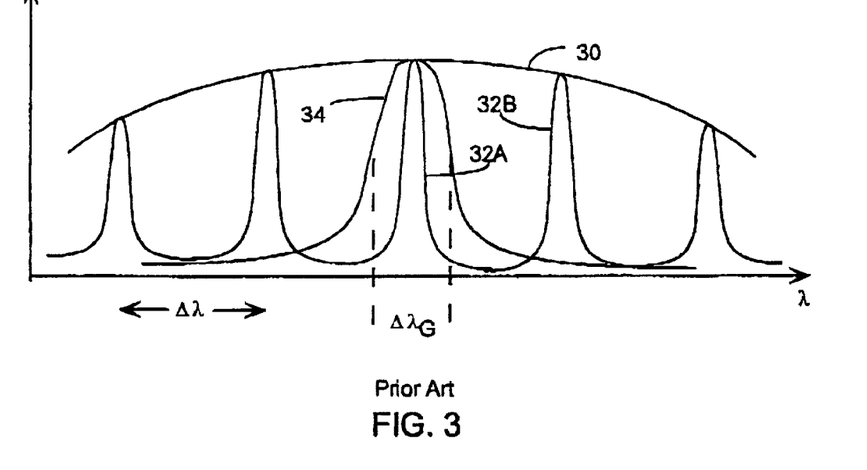
FIG. 3 shows the effect of adding a spectrally selective element such as a fiber grating to the system of FIG. 1, as is known in the art.

FIG. 3 shows the effect of adding a tuning element such as a fiber grating to system 18, as is known in the art. A curve 34 shows the resonance curve of the fiber grating, which has a bandwidth $\Delta\lambda_G$ of the same order as $\Delta\lambda$, the separation between the longitudinal cavity modes. If the grating is optically coupled to system 18, then mode 32A is present, and other modes such as mode 32B, are suppressed.

Figure 4:
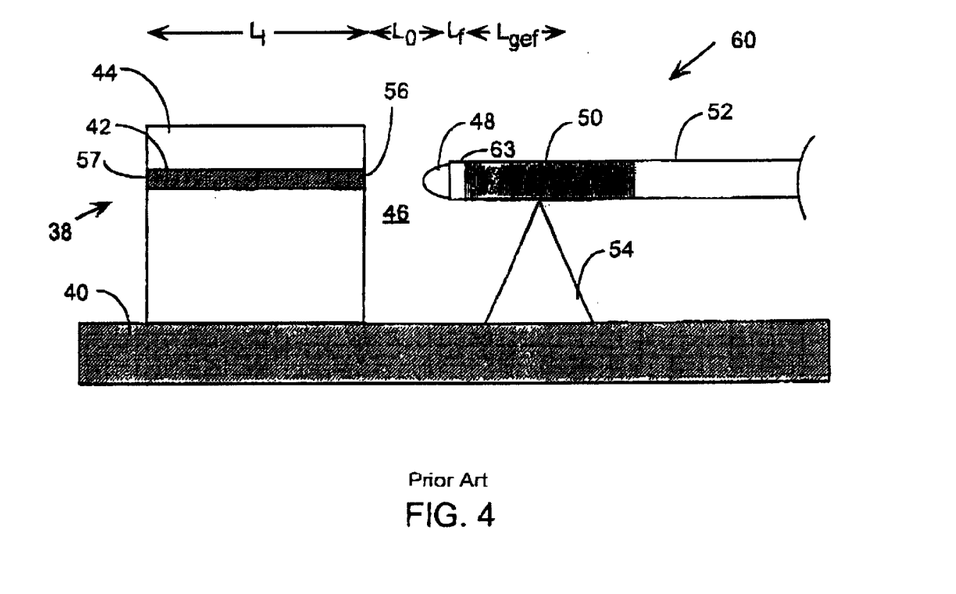
FIG. 4 is a schematic diagram showing a semiconductor gain medium coupled to a fiber grating forming a fiber grating laser (FGL), as is known in the art.

FIG. 4 is a schematic diagram showing a gain medium 38 coupled to a fiber grating 50, as is known in the art. Gain medium 38 is formed from a semiconducting gain element 44 having a laser gain region 42. Light from region 42 exits from a facet 56 of region 42 to a medium 46, and traverses medium 46 so that a lens 48 collects the light into a fiber optic 52. Fiber grating 50 is mounted in fiber optic 52, which grating reflects light corresponding to curve 34 of FIG. 3 back to region 42. The mirrors of the laser cavity comprise a rear mirror which in this example is a back facet 57 of the semiconductor gain element, and an output coupling mirror which in this example is the fiber grating. The rear and output coupling mirrors could also be reversed. In the reversed configuration the rear mirror would be the fiber grating and the output coupling mirror would be back facet 57 of the semiconductor gain element. In the reversed configuration the detector would preferably be positioned behind the fiber grating. It is desirable to eliminate parasitic reflections due to surfaces and interfaces internal to the cavity. To eliminate parasitic reflection from the facet of the interfaces internal to the cavity. To eliminate parasitic reflection from the facet of the semiconductor closest to the fiber grating, in this case facet 56, that facet is usually anti reflection coated. It is also useful to anti reflection coat a tip 49 of the fiber closest to the semiconductor gain element to again reduce parasitic reflections. Preferably, grating 50 is written directly at the end of the fiber optic facing the laser. Alternatively, a length $L_f$ of a fiber 63 is interposed between lens 48 and fiber optic grating 50. Thus region 42, medium 46, fiber optic 63 and grating 50 form a resonant system 60 corresponding to region 24 of FIG. 1. This architecture is generally known in the art as an external cavity laser or more specifically as a fiber grating laser (FGL). System 60 has an effective optical path length $L_{\mathit{eff}}$ given by:

$$L_{\mathit{eff}} = n_1 \cdot L_1 + n_0 \cdot L_0 + n_f \cdot L_f + n_g \cdot L_{\mathit{gef}} \quad (4)$$

wherein $n_1$ is a refractive index of region 42;
$L_1$ is a length of region 42;
$n_0$ is a refractive index of medium 46;
$L_0$ is a length of medium 46;
$n_f$ is a refractive index of fiber 63;
$L_f$ is the length of fiber 63.
$n_g$ is a refractive index of grating 50; and
$L_{\mathit{gef}}$ is an effective length of grating 50.

Replacing the optical path length $nL$ of equation (1b) by that given by equation (4) leads to the following equation giving cavity modes for the system of FIG. 3:

$$m \, \lambda/2 = (n_1 \cdot L_1 + n_0 \cdot L_0 + n_f \cdot L_f + n_g \cdot L_{\mathit{gef}}) \quad (5)$$

In constructing system 60, it is necessary to adjust and maintain the positions of curve 32A and 34 to have their peaks at the same wavelength. Changes in temperature and/or changes in injection current into region 42 and/or mechanical changes affect one or more parameters of the optical path length given by equation (4). Such changes can thus cause mode hopping, which refers to the phenomena whereby mode 32A shifts underneath resonance curve 34 of the fiber grating. When that shift is large enough, an adjacent mode will at some point experience a larger gain and start to lase. These mode hops occur underneath the resonance curve of the fiber grating (curve 34 in FIG. 3) resulting in wavelength shifts and intensity noise when the mode hops. For example, referring to FIG. 3, mode 32A.

U.S. Pat. No. 4,786,132 to Gordon, whose disclosure is incorporated herein by reference, describes a semiconductor laser diode coupled to a single mode optical fiber. The fiber comprises a built-in Bragg reflector grating which reflects of the order of 50% of the light from the laser back to the laser. The reflected light provides feedback to the laser so that the laser produces a single frequency output.

U.S. Pat. No. 5,077,816 to Glomb et al., whose disclosure is incorporated herein by reference, describes a narrowband laser source, a portion of the light from which is supplied to a resonant grating region in a fiberoptic, external to the laser. The current through the laser is dithered, causing the frequency of the laser to dither. The correspond in dithered light intensity transmitted by the grating is used in order to adjust the current through the laser so as to maintain the frequency of the laser at the resonant frequency of the grating.

U.S. Pat. No. 5,706,301 to Lagerstrom, whose disclosure is incorporated herein by reference, shows a laser control system which uses a fiber optic grating as a resonant control element. A difference in light intensity between laser light passing through the grating, and light which does not pass through the grating is measured, and the difference is used in order to vary the temperature of a laser generating the light, so as to maintain the frequency of the laser at the resonant frequency of the grating.

SUMMARY OF THE INVENTION

It is an object of some aspects of the present invention to provide improved methods and apparatus for stabilization of the oscillating frequency of a laser.

In preferred embodiments of the present invention, a laser assembly comprises a semiconducting laser, a fiber grating, and an optical path coupling the laser and the grating. In order to stabilize the output of the laser assembly in a single cavity mode, the effective length of an optical cavity of the laser assembly is modulated about a man value by varying the optical length of at least one of the elements forming the laser assembly. A corresponding modulation of an intensity of the laser output is measured and is coupled in a feedback loop to control the optical length of the element in the laser assembly so as to provide the desired mode stabilization.

Most preferably, the laser and the grating are assembled on an optical bench. The fiber grating is tuned so that only a single resonating mode of the laser assembly is capable of sustaining oscillation, and an output of the single mode is provided via the fiber grating. The laser assembly acts as a resonant cavity, and the fiber grating acts as a wavelength reference within the resonant cavity. The effective cavity optical length is a function of an optical length of the semiconducting laser, an effective optical length of the fiber grating, and an optical length of the optical path coupling the grating and the laser. One or more of these lengths are controlled in order to stabilize the output of the laser assembly.

A difference between the modulation of the effective cavity optical length and the modulation in intensity, preferably a difference in phase, is used as an indicator of where the cavity mode of the laser assembly is oscillating relative to the resonant curve of the fiber grating. The indicator is used within the feedback loop to maintain the oscillation at the peak of the resonant curve of the fiber grating, by varying the mean value of the effective cavity optical length of the laser assembly. Choosing at least one optical length forming the effective cavity optical length and varying the chosen optical length in order to stabilize the laser output is an adaptable and accurate way to stabilize the laser.

In some preferred embodiments of the present invention, the effective optical length of the laser assembly is modulated by periodically varying a temperature of one of the elements of the assembly about a mean temperature, thereby causing the assembly to expand and contract. The mean value of the effective optical length is varied by varying the mean temperature of the element.

In some preferred embodiments of the present invention, the semiconducting laser is mounted on a thermally insulating element, and an electric heating element is placed between the laser and the insulating element. The insulating element has the effect of ensuring that a maximal temperature increase in the laser is attained for a given input electrical power to the heating element. Thus the heating element may be used to modulate the temperature and to change the mean temperature of the laser (or of one or more other elements within the laser assembly) in a controlled manner, and thus to modulate and change the mean value of the optical length of the one or more elements.

In some preferred embodiments of the present invention, at least some of the elements comprising the laser assembly are coupled to a thermoelectric cooler, which enables the temperature of the coupled elements to be changed. Changing the temperature of the fiber grating enables its resonant wavelength to be adjusted in a controlled manner.

There is therefore provided, according to a preferred embodiment of the present invention, apparatus for stabilizing an output wavelength of a laser assembly, including:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the measured output from the detector supplies a control signal to the optical length changer to control an optical length of at least one of the optical elements, so that the cavity resonates stably at the output wavelength in the single mode.

Preferably, the optical length changer includes a heating element which varies a temperature of at least one of the optical elements, thereby varying the optical length of the at least one of the optical elements.

Preferably, the heating element includes an electric heating element, which is supplied by a direct current component and an alternating current component in order to alter and modulate a mean temperature of at least one of the optical components.

Further preferably, the heating element dissipates a modulated power having a peak value less than or equal to about 200 mW.

Preferably, the heating element includes a heat insulating element, which selectively directs heat to the at least one of the optical elements.

Preferably, the heat insulating element includes silicon dioxide.

Preferably, the plurality of optical elements includes a semiconductor gain region and a fiber grating having a resonant wavelength.

Preferably, the at least one of the optical elements whose length is varied by the optical length changer includes the semiconductor gain region.

Preferably, the plurality of optical elements includes a medium optically coupling the semiconductor gain region and the fiber grating, and the at least one of the optical elements whose length is varied by the optical length changer includes the medium.

Preferably, the optical length of the cavity is varied to substantially lock the single mode of the cavity to the resonant wavelength.

Preferably, the optical length changer varies the optical length of the at least one of the optical elements so as to correspond to the resonant wavelength.

Further preferably, the apparatus includes a thermal transfer element which varies a temperature of at least one of the optical elements, thereby varying the optical length of the cavity.

Preferably, the thermal transfer element includes a cooling element, which is thermally coupled to the laser assembly and which extracts heat from the laser assembly so as to reduce an overall temperature of at least one of the plurality of optical elements.

Preferably, the cooling element is operated by the stabilizer, and the cooling element extracts heat from the laser assembly responsive to the measured output from the detector.

There is further provided, according to a preferred embodiment of the present invention, a method for stabilizing a laser assembly, the assembly including a plurality of elements each having a respective effective optical length, the plurality of elements forming a cavity resonating at a lasing wavelength in a single mode and having an effective cavity length, the method including:

modulating at least one of the effective optical lengths;

monitoring a radiation output of the assembly responsive to the modulation; and adjusting the effective cavity length responsive to the output and to the modulation, so as to maintain the cavity resonating at the wavelength in the single mode.

Preferably, modulating the at least one of the effective lengths includes modulating a temperature of at least one of the plurality of elements.

Preferably, modulating the temperature includes providing a heating element which heats at least one of the plurality of elements so as to change the effective length of the at least one of the plurality of elements.

Further preferably, modulating the temperature includes providing a cooling element which cools at least one of the plurality of elements so as to change the effective length of the at least one of the plurality of elements.

Preferably, adjusting the effective cavity length includes adjusting a temperature of at least one of the plurality of elements.

Preferably, adjusting the effective cavity length includes adjusting at least one of the effective optical lengths.

Preferably, modulating the at least one of the effective optical lengths includes measuring a phase of a modulation of the effective optical length, monitoring the radiation output includes monitoring a radiation output phase and evaluating a comparison of the phase of the modulation of the effective optical length with the radiation output phase, and adjusting the effective cavity length includes adjusting at least one of the effective optical lengths responsive to the comparison.

Preferably, adjusting the effective cavity length includes adjusting the length responsive to the monitored radiation output substantially without reliance on an external wavelength reference.

Preferably, the method includes varying a resonant wavelength of at least one of the plurality of elements responsive to the single mode of the cavity.

There is further provided, according to a preferred embodiment of the present invention, laser apparatus, including:

a plurality of optical elements coupled together so as to form a laser cavity resonating in a single mode, one of the plurality of elements having a tunable resonant wavelength; and a thermal transfer element which is adapted to vary a temperature of the one of the plurality of elements so as to tune the resonant wavelength to correspond with the single mode.

Preferably, the one of the plurality of elements includes a fiber grating.

There is further provided, according to a preferred embodiment of the present invention, laser apparatus, including:

a plurality of optical elements coupled together so as to form a laser cavity resonating in a single mode, one of the plurality of elements having a tunable resonant wavelength; and a thermal transfer element which is adapted to vary a temperature of the one of the plurality of elements so as to tune the resonant wavelength to correspond with the single mode.

Preferably, the one of the plurality of elements includes a fiber grating.

There is further provided, according to a preferred embodiment of the present invention, laser apparatus, including:

a plurality of optical elements coupled together so as to form a laser cavity resonating in a single mode, a first one of the plurality of elements having a resonant wavelength; and a thermal transfer element which is adapted to vary a temperature of at least a second one of the plurality of elements, so as to tune the single mode to correspond with the resonant wavelength.

Preferably, the first one of the plurality of elements includes a fiber grating.

There is further provided, according to a preferred embodiment of the present invention, a method for generating a laser output, including:

coupling a plurality of optical elements together so as to form a laser cavity resonating in a single mode, one of the plurality of elements having a tunable resonant wavelength; and varying a temperature of the one of the plurality of elements so as to tune the resonant wavelength to correspond with the single mode.

Preferably, the one of the plurality of elements includes a fiber grating.

There is further provided, according to a preferred embodiment of the present invention, a method for generating a laser output, including:

a plurality of optical elements coupled together so as to form a laser cavity resonating in a single mode, a first one of the plurality of elements having a resonant wavelength; and a thermal transfer element which is adapted to vary a temperature of at least a second one of the plurality of elements, so as to tune the single mode to correspond with the resonant wavelength.

Preferably, the first one of the plurality of elements includes a fiber grating.

The present invention will be more fully understood from the following detailed description of the preferred embodiments thereof, taken together with the drawings, in which:

DETAILED DESCRIPTION OF PREFERRED EMBODIMENTS

Figure 5:
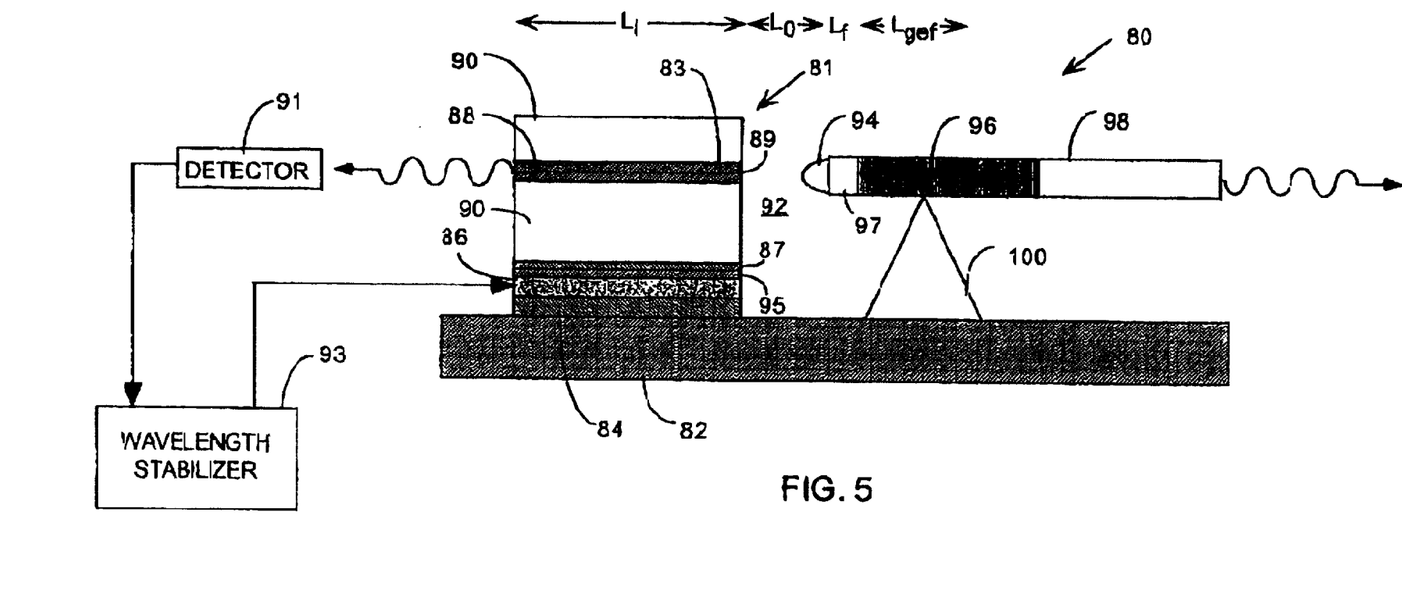
FIG. 5 is a schematic illustration showing a stabilized fiber grating laser system, according to a preferred embodiment of the present invention.

Reference is now made to FIG. 5, which is a schematic illustration showing a stabilized fiber grating laser system 80, according to a preferred embodiment of the present invention. A semiconducting gain region 88 is formed in a gain medium 83, between non-lasing semiconductor regions 90 of the medium, as is known in the art. Region 88 has a length represented by $L_1$, and has a refractive index $n_1$. Preferably, semiconductor gain medium 83 is any industry-standard laser diode, such as an indium phosphide diode, having a generally box-like shape, and having a facet 89 anti reflection coated. Hereinbelow medium 83 is assumed to be a diode 81 comprising the above characteristics. Diode 81 is mounted on a heating element 86, which is mot preferably a thin film resistor and which acts as a thermal transfer element. Heating element 86 is in turn mounted on a thermal insulator 84, preferably formed from silicon dioxide, although any other thermal insulator could be used.

A substrate 82, which is preferably a good heat conductor, such as silicon, supports insulator 84. Substrate 82 also supports a fiber optic support 100, which holds a fiber optic 98. Preferably, substrate 82 is a good electrical insulator. Alternatively, if the substrate is an electrical conductor and element 86 comprises a resistor such as a thin film resistor, the resistor is electrically isolated from the substrate. In the event that silicon dioxide is used as thermal insulator 84 it also acts as an electrical isolator. In order to provide electrical contact to the diode, two additional layers are required for operation of the laser. An upper layer 87 is a contact layer to the diode, providing a path for current injected into the diode. A lower layer 95 between layer 87 and element 86 is an electrical isolation layer between the contact layer and the element.

Fiber optic 98 is optically coupled to a fiber grating 96, which has an effective length $L_{gef}$, a refractive index $n_g$, and a tuned wavelength $\lambda_f$. Fiber grating 96 is in turn optically coupled to a lens 94. A length $L_f$ of fiber 97 with index $n_f$ is interposed between the lens and the fiber grating. A medium 92, which may be air or vacuum or any other optically transparent medium, separates lens 94 from semiconductor gain medium 83. Medium 92 has a length $L_0$ and a refractive index $n_0$.

As described in the Background of the Invention, system 80 will resonate at a wavelength λ when:

$$m \cdot \lambda/2 = L_{eff} = (n_1 \cdot L_1 + n_0 \cdot L_0 + n_f L_f + n_g \cdot L_{gef}) \quad (5)$$

wherein $L_{eff}$ is the total effective optical length of system 80:

$n_1 \cdot L_1$ corresponds to an optical length of region 88;

$n_0 = L_0$ corresponds to an optical length of region 92;

$n_f = L_f$ corresponds to an optical length of region 97; and $n_g \cdot L_{gef}$ corresponds to an optical length of region 96.

As described herein, the wavelength of system 80 is stabilized to the tuned wavelength of the peak of the resonance curve of the fiber grating, $\lambda_f$, by adjusting the effective length $L_{eff}$.

In order to stabilize system 80, a wavelength stabilizer 93 supplies an electric current of heating element 86. Most preferably, the current comprises a direct current component and an alternating current component, the levels of which components are separately adjustable by stabilizer 93. Preferably, the frequency of the alternating current is set to be less than about 5 kHz. The current supplied by stabilizer 93 has the effect on both raising the mean temperature of diode 81, and of varying the temperature about the mean temperature with a frequency equal to that of the applied alternating current. As described in more detail below, heating element 86 and insulator 84 act as an optical length changer by changing the temperature of diode 81. The changes in temperature alter the optical length of system 80, which in turn changes the intensity of the laser radiation emitted by region 88 of diode 81, and the changes in emitted intensity are used in a feedback loop to stabilize the wavelength emitted by the system.

A portion of the laser radiation from region 88 is captured by a detector 91. Detector 91 is preferably any industry-standard optical radiation detector, for example comprising InGaAs, which is able to measure the intensity of the radiation incident on the detector. Changes of radiation intensity, as measured by detector 91, are fed back to stabilizer 93, and the measured changes are used by the stabilizer to vary the level of the direct current supplied to element 86. The level of the direct current is adjusted by stabilizer 93 in a feedback loop so as to maintain the wavelength of system 80 at a substantially fixed value determined by the resonance curve of the fiber grating.

Figure 6:
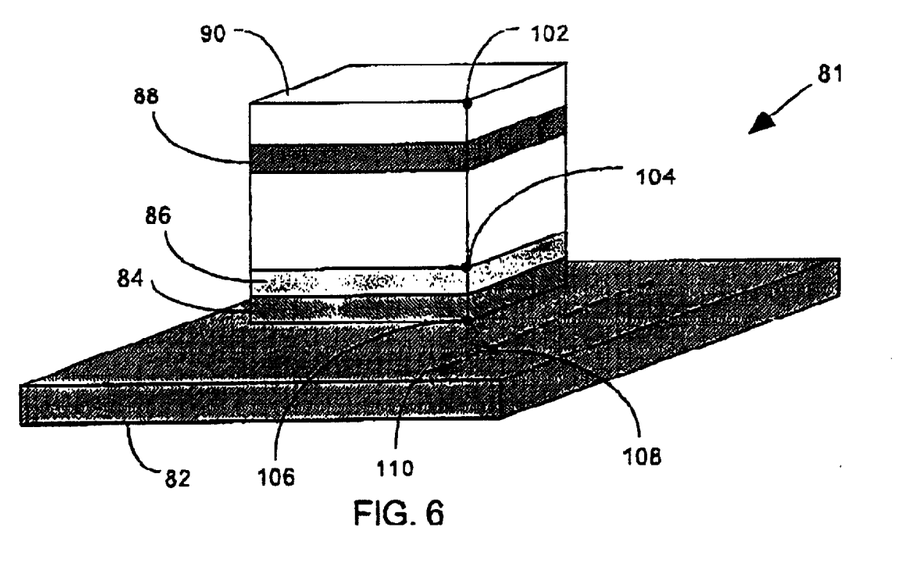
FIG. 6 is a schematic perspective diagram of a diode assembly comprised in the system of FIG. 5, according to a preferred embodiment of the present invention.
Figure 7A:
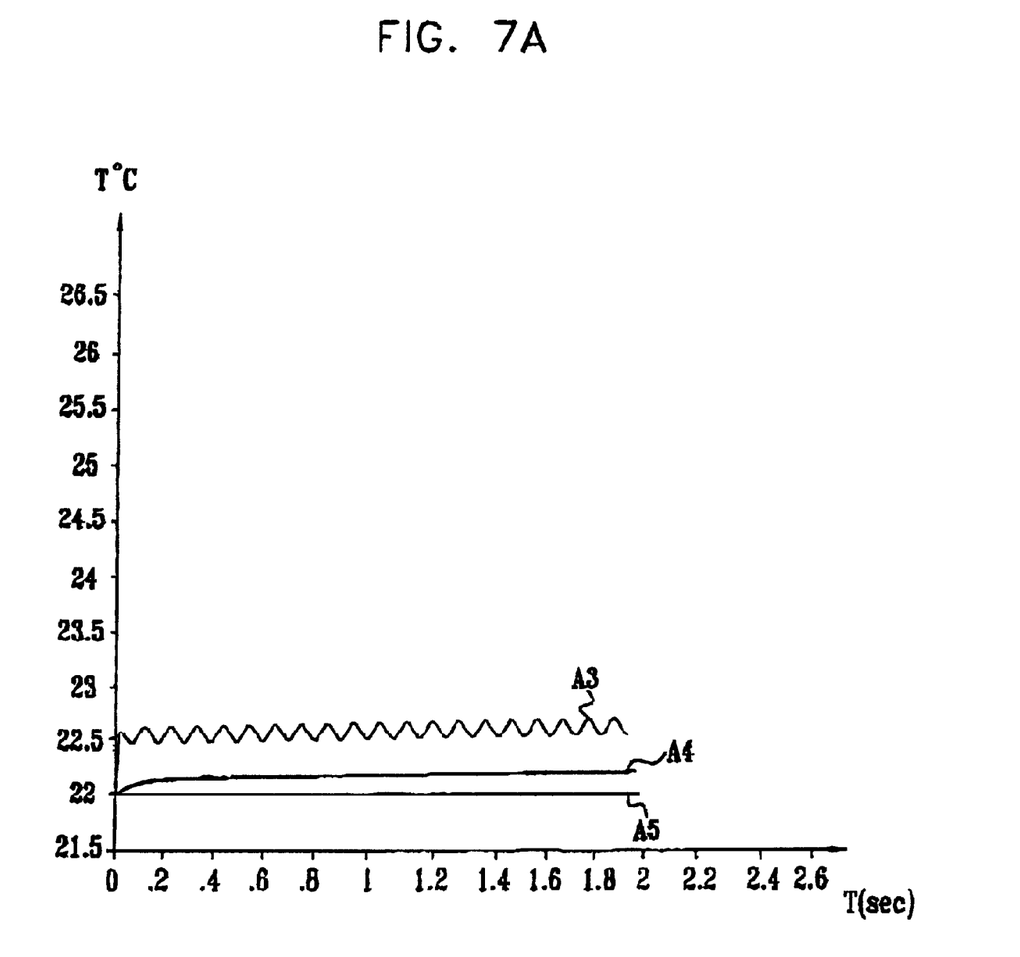
FIGS. 7A, 7B, and 7C are temperature vs. time graphs for different points in the diode assembly shown in FIG. 6 for different thicknesses of a heat insulator, according to a preferred embodiment of the present invention.
Figure 7B:
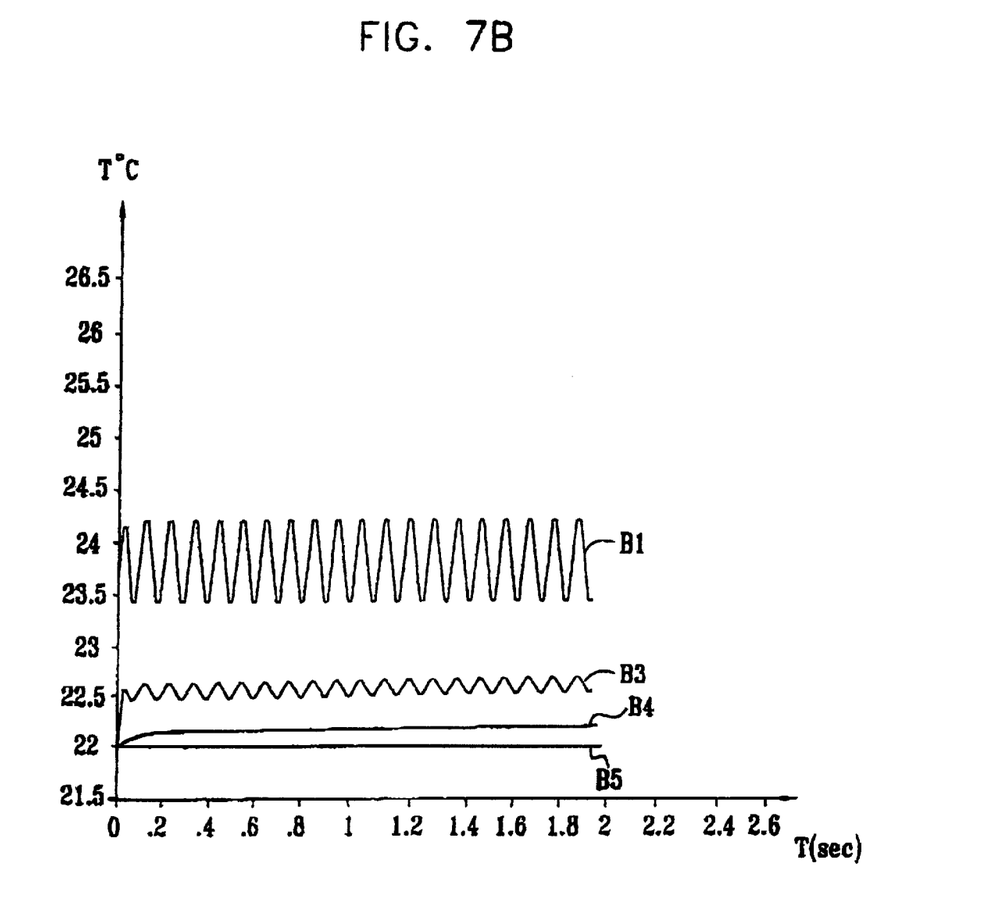
Figure 7C:
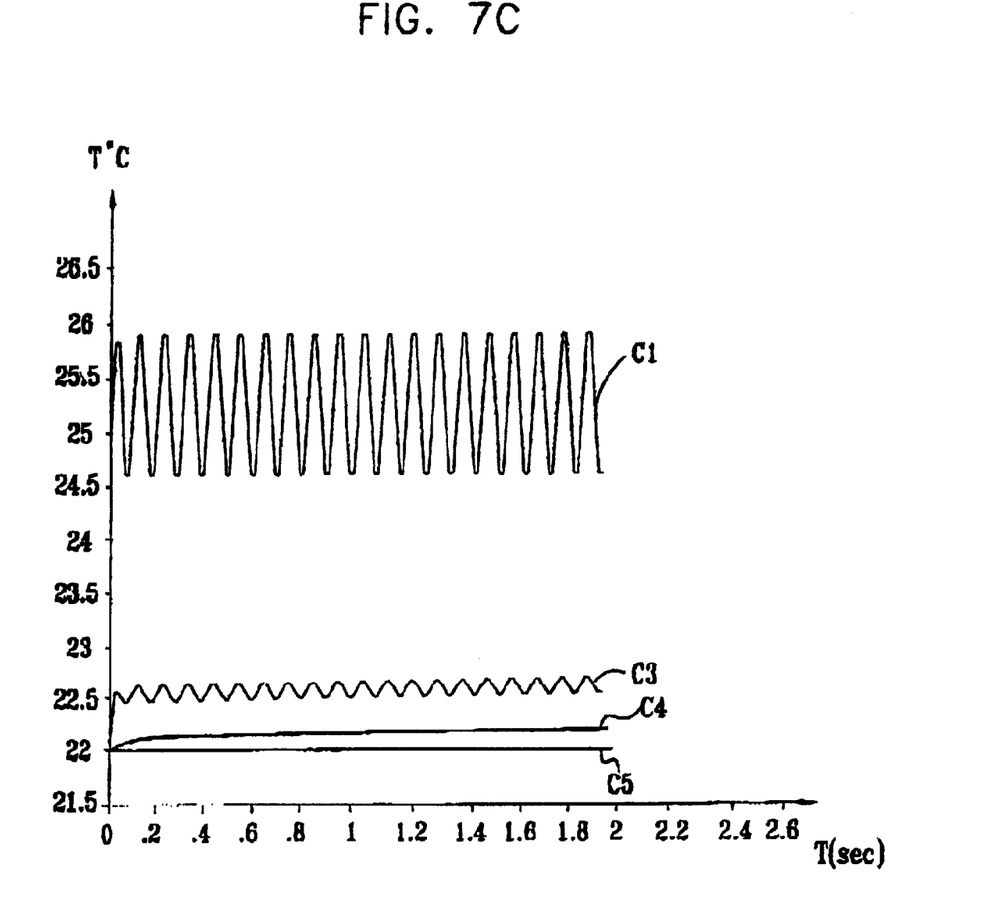

FIG. 6 is a schematic perspective diagram of diode assembly 81, showing different positions in the assembly, according to a preferred embodiment of the present invention. FIGS. 7A, 7B, and 7C are temperature vs. time graphs for the positions shown in FIG. 6 using different thicknesses of heating insulator 84, according to a preferred embodiment of the present invention. Electrical contact pad 87 to the diode 81 and electrical insulation layer 95 between the contact pad and heating element 86 are not shown since they only have a marginal effect on the performance of thermal insulating layer 84. FIGS. 7A, 7B, and 7C are derived by simulating heating diode assembly 81 with respective thicknesses 0 µm, 1 µm, and 2 µm, for insulator 84 (i.e., in FIG. 7A, insulator 84 is not present). The graphs are generated by applying to diode assembly 81, for an ambient temperature of 22° C., the time-dependent heat diffusion equation:

$$\nabla^2 T + \frac{q}{k} = \frac{1}{a}\frac{\partial T}{\partial t} \quad (6)$$

wherein T is the temperature, q is the rate of heat generation, k is the heat conduction coefficient, a is the thermal diffusivity, and t is time.

Most preferably, the simulation is performed on an industry-standard software package, such as the ANSYS finite element software program distributed by ANSYS, Inc. of Southpointe, Canonsburg, Pa.

Diode assembly 81 has dimensions of length×width× height approximately equal to 300 µm×300 µm×100 µm. Positions 102 and 104 correspond respectively to top and bottom corners of assembly 81. A position 106 corresponds to a point on substrate 82 directly beneath corner 104 and insulator 84. Positions 108 and 110 correspond to points on the substrate respectively distant 300 µm and 1000 µm from point 106.

To generate graphs for FIGS. 7A, 7B, and 7C, a sinusoidal power modulation having a peak substantially equal to 50 mW is applied to heating element 86, and laser assembly 81 is assumed to dissipate a further substantially constant power equal to 100 mW.

Referring to FIG. 7A, graph A5 corresponds to result obtained for position 110, graph A4 corresponds to results obtained for position 108, and graph A3 corresponds substantially to results obtained for positions 102, 104 and 106. The graphs show that, when steady-state conditions are achieved, at position 110 the temperature is substantially equal to the ambient temperature, and at position 108 the temperature is approximately 0.2° C. above the ambient temperature. At position 110 and position 108 the respective temperatures have substantially zero temperature modulation. At positions 102, 104, and 106 the mean temperature is 22.5° C. and there is a peak-peak temperature modulation of 0.15° C. Thus region 88 (between positions 102 and 104) has a mean temperature substantially equal to 22.5° C. and a peak-peak temperature modulation substantially equal to 0.15° C., when no insulator is present.

Graphs B5, B4, and B3 (FIG. 7B) correspond respectively to results obtained for positions 110, 108, and 106. Graph B1 corresponds to results obtained for position 104, and also substantially to results for position 102. The results shown by graphs B5, B4, and B3 are respectively substantially as described above for graphs A5, A4, and A3. Graph B1 shows that at positions 102 and 104, the mean temperature is 24° C. and there is a peak-peak temperature modulation of 0.75° C., so that these mean and peak-peak values correspond to the values for region 88 when a 1 µm insulator is present.

Graphs C5, C4, and C3 (FIG. 7C) correspond respectively to results obtained for positions 110, 108, and 106. Graph C1 corresponds to results obtained for position 104 and also substantially to results for position 102. The results shown by graphs C5, C4, and C3 are respectively substantially as described above for graphs A5, A4, and A3. Graph C1 shows that at positions 102 and 104, the mean temperature is 25.25° C. and there is a peak-peak temperature modulation of 1.25° C., so that these mean and peak-peak values correspond to the values for region 88 when a 2 µm insulator is present.

Comparison of graphs A3, B1, and C1, shows that as the thickness of insulator 84 is increased from 0 µm to 1 µm to 2 µm, the peak-peak temperature modulation of semiconductor regions 90 increases from 0.15° C. to 0.75° C. to 1.25° C., and the mean temperature increases from 22.5° C. to 24° C. to 25.25° C. Thus, when insulator 84 has a thickness of 2 µm, there is an effective gain of temperature modulation equal to 1.25/0.15 i.e., a gain of approximately 8. When insulator 84 has a thickness of 1 µm, the effective gain is 0.75/0.15=5.

Modulating the temperature of regions 90 correspondingly modulates the physical length $L_1$ of diode 81, due to thermal expansion and contraction of the diode, and also modulates the refractive index $n_1$ of the diode. Thus the optical length $L_{eff}$ of assembly 81 is modulated in phase with the modulation in temperature.

Figure 8:
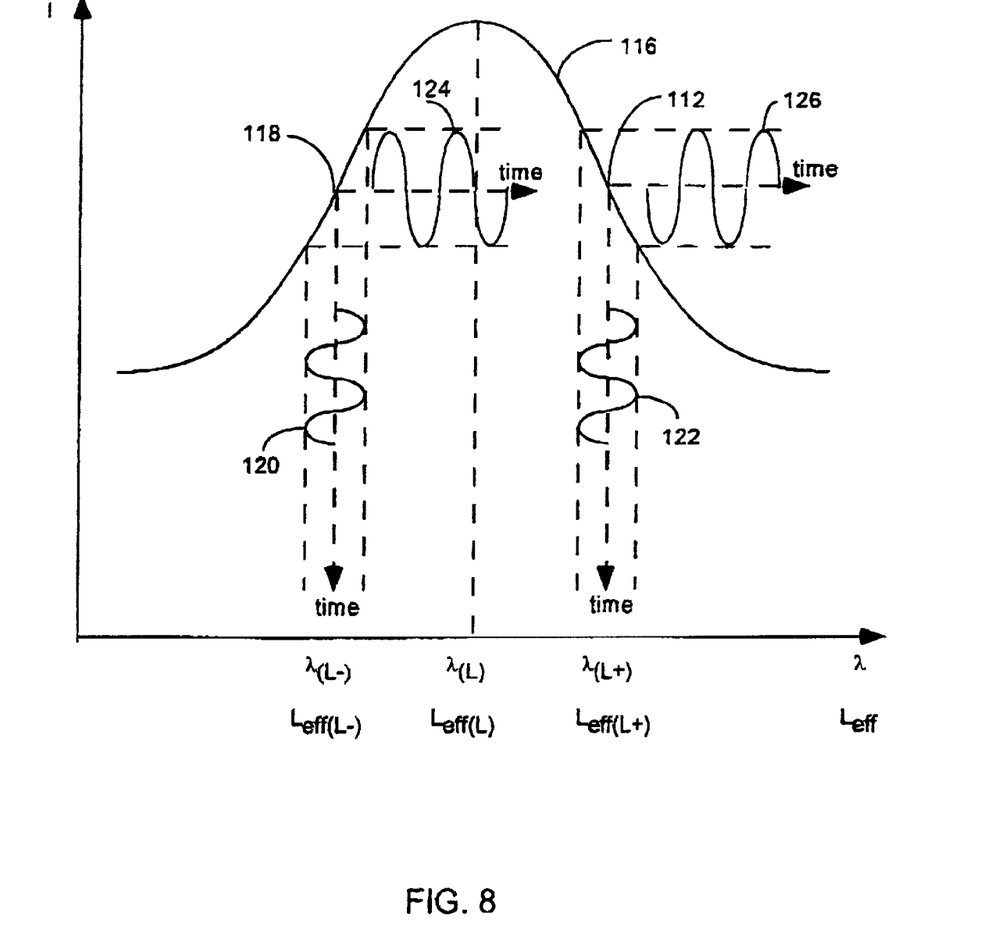
FIG. 8 is a graph showing schematically the effect of modulation of an optical length on the intensity of radiation emitted by the system of FIG. 5, according to a preferred embodiment of the present invention.

FIG. 8 is a schematic graph showing the effect of modulation of optical length $L_{eff}$ on the intensity of radiation emitted by system 80, according to a preferred embodiment of the present invention. A graph 116 represents the graph of intensity I vs. wavelength λ for a longitudinal cavity mode at which system 80 is lasing, wherein the resonant wavelength of the mode is $\lambda_L$, and wherein the effective length of system 80 is $L_{eff(L)}$. At a point 118 on graph 116 system 80 has an effective length $L_{eff(L-)}$, less than $L_{eff(L)}$, and the wavelength produced by the assembly is $\lambda_{L-}$, less than $\lambda_L$. At a point 112 on graph 116 system 80 has an effective length $L_{eff(L+)}$, greater than $L_{eff(L)}$, and the wavelength produced by the system is $\lambda_{L+}$, greater than $\lambda_L$.

Graphs 120 and 122 are graphs of modulation of $L_{eff}$ vs. time t, at respective mean lengths $L_{eff(L-)}$ and $L_{eff(L+)}$. Graphs 120 and 122 correspond to one of the temperature vs. time modulation graphs $A_3$, $B_1$, or $C_1$, depending on the thickness of insulator 84. At mean length $L_{eff(L-)}$, corresponding to system 80 operating at wavelength $\lambda_{L-}$, a graph 124 represents the intensity I vs. time t graph produced by the system. Comparison of graphs 120 and 124 shows that the modulation of optical length $L_{eff}$ is substantially in phase with the intensity I produced by system 80. At mean length $L_{eff(L+)}$, corresponding to system 80 operating at wavelength $\lambda_{L+}$, a graph 126 represents the intensity I vs. time t graph produced by the assembly. Comparison of graphs 122 and 126 shows that the modulation of $L_{eff}$ is substantially 180° out of phase with the intensity I produced by system 80. At mean length $L_{eff(L)}$, i.e., when system 80 produces resonant wavelength $\lambda_L$, the modulation of $L_{eff}$ produces an intensity I by system 80 which is modulated at a frequency which is twice the effective length modulation frequency. Thus, comparison of modulation parameters such as the phase and/or frequency of the modulation of optical length $L_{eff}$ with the phase and/or frequency of the output intensity I can be used as a measure indicating where on curve 116 system 80 is operating.

Returning to FIG. 5, modulating optical length $L_{eff}$ by varying the temperature of diode 81 causes a corresponding modulation in radiation intensity produced by assembly 80. The modulation in radiation intensity is registered by detector 91, and the modulation in temperature is set to be as small as possible, but large enough so that the modulation in radiation intensity is large enough to provide a single to noise ratio sufficient to stabilize the wavelength utilizing the control loop. The temperature modulation also causes heat dissipation which raises the mean temperature of diode 81. However, a rise in mean temperature of diode 81 reduces the mean radiation intensity emitted by the diode. Thus, a thickness of insulator 84 and the DC and AC components of the current supplied by stabilizer 93 are chosen so that the peak-peak temperature modulation of diode 81 is high enough to provide the required effective length modulation, while the mean temperature rise of the diode is as small as possible. Most preferably, the thickness of insulator 84 when the insulator is silicon dioxide is set to be of the order of 1 μm, and the AC component of the current is set to supply a peak-peak power of the order of 50 mW to heater 86. Further most preferably, the DC temperature level due to the DC current provided to element 86 is set by the control loop to adjust the cavity mode to the center of resonance of the fiber grating. Those skilled in the art will be able to evaluate a corresponding thickness of insulator 84 when the structure of the cavity is different from that described hereinabove, for example, when the insulator, substrate, or laser, are of different materials.

Signals from detector 91, responsive to the modulation in radiation intensity, are compared in stabilizer 93 to the alternating current signals applied to heater 86. Most preferably, the phases of the detector signals and the alternating current are compared to determine a position on a resonant curve of assembly 80 where the assembly is operating, as described above with reference to FIG. 8. Alternatively or additionally, other measures are used to determine the position on the resonant curve of assembly 80. For example, one measure is the slope of the change of the laser intensity due to a change in wavelength, caused by an effective length change due to a temperature change. A positive slope is associated with a mean length $L_{eff(L-)}$, corresponding to system 80 operating at wavelength $\lambda_{L-}$. A negative slope is associated with a mean length $L_{eff(L+)}$, corresponding to system 80 operating at wavelength $\lambda_{L+}$. A substantially zero slope is associated with mean length $L_{eff(L)}$, corresponding to system 80 operating at wavelength $\lambda_L$ which is the peak wavelength of the resonance curve of the fiber grating. Stabilizer 93 uses the determined position in order to set a level of the direct current applied to heater 86, thereby altering the mean temperature of diode 81, so as to maintain assembly 80 resonating at a substantially constant resonating wavelength $\lambda_L$.

Figure 9:
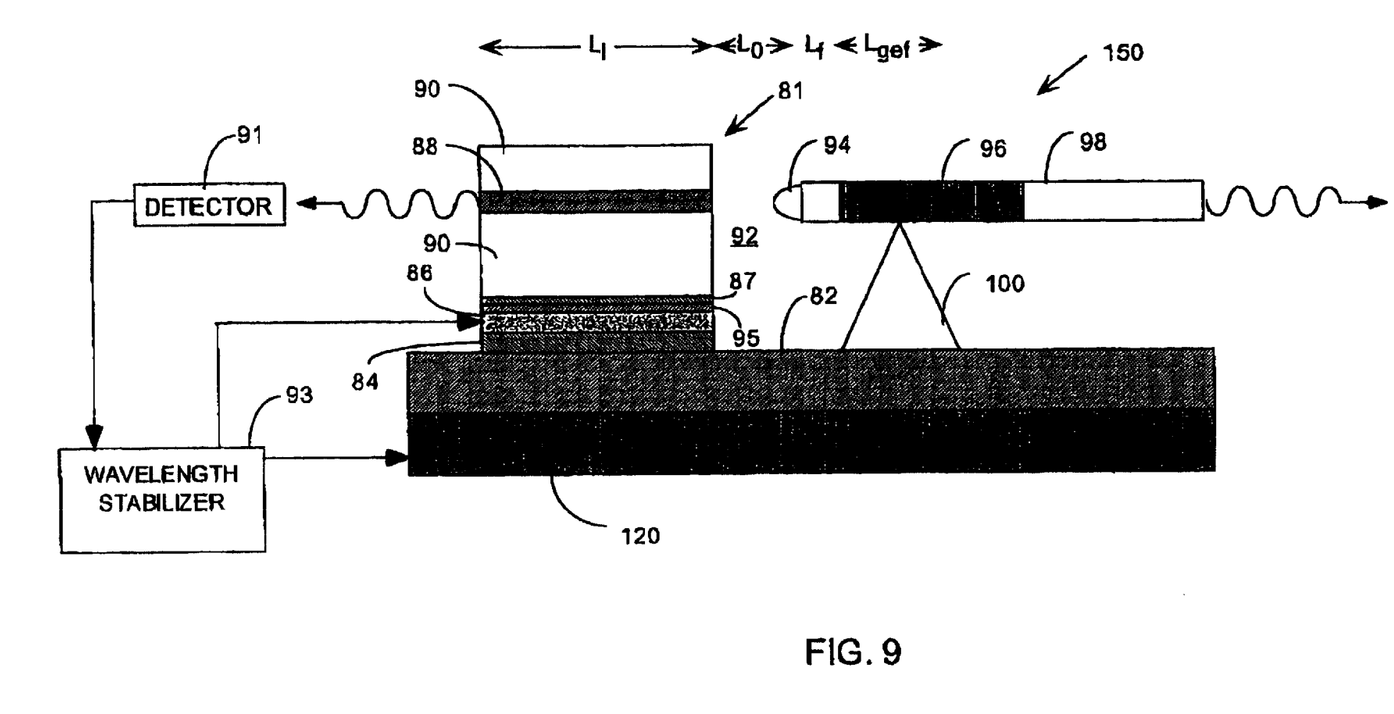
FIG. 9 is a schematic diagram of a stabilized fiber grating laser system, according to an alternative preferred embodiment of the present invention.

FIG. 9 is a schematic diagram of a stabilized fiber grating laser system 150, according to an alternative preferred embodiment of the present invention. Apart from the differences described hereinbelow, the operation of assembly 150 is generally similar to that of assembly 80, so that elements indicated by the same reference numerals in both assembly 150 and assembly 80 are generally identical in construction and operation. Substrate 82 is mounted on a thermoelectric cooler 120, such as a model SP1020 produced by Marlow Industries, Inc., of Dallas, Tex., although any other standard or custom-built thermoelectric cooler may be used. Cooler 120 is a thermal transfer element which is generally utilized to control the mean temperature of lasers of different varieties and can also be used for the same purpose in embodiments of the present invention. As is known in the art, the mean temperature of a laser is affected by intrinsic effects like laser power dissipation or extrinsic effects like environmental effects. Cooler 120 is preferably powered by a power source external to assembly 150. Alternatively cooler 120 is powered by a power source internal to assembly 150, for example stabilizer 93 may act as a power source.

Cooler 120 can be used to reduce the mean temperature rise of diode 81 caused by modulation of element 86, required to produce a modulation of the effective length. Most preferably, cooler 120 is operated so as to allow insulator 84 to be thicker than in system 80, by extracting heat from substrate 82, thereby reducing the mean temperature of diode 81 and/or assembly 150 and allowing a larger peak to peak temperature modulation to be applied to the diode and/or the assembly for the same modulation input power to element 86.

Most preferably, stabilizer 93 varies a mean temperature of diode 81 and/or other elements of assembly 150 as described hereinabove for system 80. Stabilizer 93 can change the mean temperature by applying power to element 86 or cooler 120. Preferably, cooler 120 is operated so as to extract heat from substrate 82 at a substantially constant rate in order to control the mean temperature of system 150. The mean temperature varies slowly due to intrinsic effects like laser power dissipation or extrinsic effects like environmental effects.

Alternatively, cooler 120 can be operated so as to vary the mean temperature of system 150 or any of its component parts, the variation being adjusted by stabilizer 93 together with the other parameters varied by the stabilizer, as described hereinabove, so that the wavelength radiated by system 150 is maintained at a substantially constant value. Further alternatively, cooler 120 is operated so as modulate the temperature of system 150, the modulation being adjusted by stabilizer 93 together with the other parameters varied by the stabilizer, as described hereinabove, so that the wavelength radiated by system 150 is maintained at a substantially constant value.

It will be appreciated that element 86 and cooler 120 can take on together or separately the duties of producing the modulation to the effective length, of adjusting the wavelength of the peak of the resonance of the fiber grating, and/or related duties. While element 86 can only heat, cooler 120 can heat and cool. For example, current accuracy for writing a fiber grating is about +/−0.05 nm of the nominal resonant wavelength, and a temperature sensitivity of the resonant wavelength of the fiber grating is of the order of 0.01 nm/° C. To obtain a better wavelength accuracy for a laser system such as system 80, a grating in the system is temperature tuned. In the above example, varying the temperature by of the order of +/−5° C., using a heater such as element 86 and/or a cooler such as cooler 120, brings the resonant wavelength of the fiber grating to its nominal resonant wavelength. The stabilization method described hereinabove can then be used to lock the cavity mode to the peak of the resonance curve of the fiber grating. Alternatively or additionally, the effective length of the cavity can be changed by varying the temperature of the diode, for example, by using a heater such as element 86.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to generate accordingly a modulation of the optical length of the cavity about a mean value thereof;

a detector which monitors the output of the laser assembly responsive to the modulation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode.

2. Apparatus according to claim 1, wherein the optical length changer comprises a heating element which varies a temperature of the at least one of the optical elements, thereby varying the optical length of the at least one of the optical elements.

3. Apparatus according to claim 2, wherein a first of the plurality of elements has a resonant wavelength, and wherein the heating element varies the temperature of a second of the plurality of elements, so that the output wavelength corresponds to the resonant wavelength.

4. Apparatus according to claim 1, an comprising a thermal transfer element which varies a temperature of at least one of the optical elements, thereby varying the optical length of the cavity.

5. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode, wherein the optical length changer comprises a heating element which varies a temperature of at least one of the optical elements, thereby varying the optical length of the at least one of the optical elements, and wherein the heating element comprises an electric heating element, which is supplied by a direct current component and an alternating current component in order to alter and modulate a mean temperature of at least one of the optical components.

6. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode, wherein the optical length changer comprises a heating element which varies a temperature of at least one of the optical elements, thereby varying the optical length of the at least one of the optical elements, and wherein the heating element dissipates a modulated power having a peak value less than or equal to about 200 mW.

7. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode, wherein the optical length changer comprises a heating element which varies a temperature of at least one of the optical elements, thereby varying the optical length of the at least one of the optical elements, and wherein the heating element comprises a heat insulating element, which selectively directs heat to the at least one of the optical elements.

8. Apparatus according to claim 7, wherein the heat insulating element comprises silicon dioxide.

9. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode, wherein the plurality of optical elements comprises a semiconductor gain region and a fiber grating having a resonant wavelength.

10. Apparatus according to claim 9, wherein the at least one of the optical elements whose length is varied by the optical length changer comprises the semiconductor gain region.

11. Apparatus according to claim 9, wherein the plurality of optical elements comprises a medium optically coupling the semiconductor gain region and the fiber grating, and wherein the at least one of the optical elements whose length is varied by the optical length changer comprises the medium.

12. Apparatus according to claim 9, wherein the optical length of the cavity is varied to substantially lock the single mode of the cavity to the resonant wavelength.

13. Apparatus according to claim 9, wherein the optical length changer varies the optical length of the at least one of the optical elements so as to correspond to the resonant wavelength.

14. Apparatus for stabilizing an output wavelength of a laser assembly, comprising:

a plurality of optical elements coupled together so as to form a laser cavity resonating in a single mode dependent upon an optical length of the cavity;

an optical length changer which varies an optical length of at least one of the optical elements so as to vary accordingly the optical length of the cavity;

a detector which monitors the output of the laser assembly responsive to the variation in the optical length of the at least one of the optical elements; and a stabilizer which responsive to the output from the detector supplies a control signal to the optical length changer to control the optical length of the at least one of the optical elements, so that the cavity resonates stably at the output wavelength in the single mode, and comprising a thermal transfer element which varies a temperature of at least one of the optical elements, thereby varying the optical length of the cavity, wherein the thermal transfer element comprises a cooling element, which is thermally coupled to the laser assembly and which extracts heat from the laser assembly so as to reduce an overall temperature of at least one of the plurality of optical elements.

15. Apparatus according to claim 14, wherein the cooling element is operated by the stabilizer, and wherein the cooling element extracts heat from the laser assembly responsive to the measured output from the detector.

16. A method for stabilizing a laser assembly, the assembly comprising a plurality of elements each having a respective effective optical length, the plurality of elements forming a cavity resonating at a lasing wavelength in a single mode and having an effective cavity length, the method comprising:

varying at least one of the effective optical lengths so as to generate a modulation of the cavity length about a mean value thereof;

monitoring a radiation output of the assembly responsive to the modulation; and adjusting the effective cavity length responsive to the output and to the modulation, so as to maintain the cavity resonating at the wavelength in the single mode.

17. A method according to claim 16, wherein modulating the at least one of the effective lengths comprises modulating a temperature of at least one of the plurality of elements.

18. A method according to claim 17, wherein modulating the temperature comprises providing a heating element which heats the at least one of the plurality of elements so as to change the effective length of the at least one of the plurality of elements.

19. A method according to claim 16, wherein adjusting the effective cavity length comprises adjusting a temperature of at least one of the plurality of elements.

20. A method according to claim 16, wherein adjusting the effective cavity length comprises adjusting the at least one of the effective optical lengths.

21. A method according to claim 16, wherein modulating the at least one of the effective optical lengths comprises measuring a modulation parameter of the effective optical length, wherein monitoring the radiation output comprises monitoring a radiation output and comparing the modulation parameter of the effective optical length with the radiation output so as to generate a comparison therebetween, and wherein adjusting the effective cavity length comprises adjusting at least one of the effective optical lengths responsive to the comparison.

22. A method according to claim 16, wherein adjusting the effective cavity length comprises adjusting the length responsive to the monitored radiation output substantially without reliance on an external wavelength reference.

23. A method according to claim 16, and comprising varying a resonant wavelength of at least one of the plurality of elements responsive to the single mode of the cavity.

24. A method for stabilizing a laser assembly, the assembly comprising a plurality of optical elements each having a respective effective optical length, the plurality of elements forming a cavity resonating at a lasing wavelength in a single mode and having an effective cavity length, the method comprising:

modulating at least one of the effective optical lengths;

monitoring a radiation output of the assembly responsive to the modulation; and adjusting the effective cavity length responsive to the output and t the modulation, so as to maintain the cavity resonating at the wavelength in the single mode, wherein modulating the at least one of the effective lengths comprises modulating a temperature of at least one of the plurality of the optical elements, and wherein modulating the temperature comprises:

providing a heat insulating element; and directing heat selectively to the at least one of the plurality of the optical elements, using the heat insulating element.

25. A method for stabilizing a laser assembly, the assembly comprising a plurality of elements each having a respective effective optical length, the plurality of elements forming a cavity resonating at a lasing wavelength in a single mode and having an effective cavity length, the method comprising:

modulating at least one of the effective optical lengths;

monitoring a radiation output of the assembly responsive to the modulation; and adjusting the effective cavity length responsive to the output and to the modulation, so as to maintain the cavity resonating at the wavelength in the single mode, wherein modulating the at least one of the effective lengths comprises modulating a temperature of at least one of the plurality of elements, and wherein modulating the temperature comprises providing a cooling element which cools the at least one of the plurality of elements so as to change the effective length of the at least one of the plurality of elements.

26. Laser apparatus, comprising:

a plurality of optical elements coupled together so as to form a laser cavity resonating in a single mode, one of the plurality of elements having a tunable resonant wavelength; and a thermal transfer element which modulates a temperature of the one of the plurality of elements about a mean temperature thereof so as to generate a modulated laser output, and which varies the mean temperature in response to the modulated laser output so as to tune the resonant wavelength to correspond with the single mode.

27. Laser apparatus, comprising:

a plurality of optical elements coupled together so as to form a laser cavity resonating in a single mode, one of the plurality of elements having a tunable resonant wavelength; and a thermal transfer element which is adapted to vary a temperature of the one of the plurality of elements so as to tune the resonant wavelength to correspond with the single mode, wherein the one of the plurality of elements comprises a fiber grating.

28. Laser apparatus, comprising:

a plurality of optical elements coupled together so as to form a laser cavity resonating in a single mode, a first one of the plurality of elements having a resonant wavelength; and a thermal transfer element which modulates a temperature of at least a second one of the plurality of elements about a mean temperature thereof so as to generate a modulated laser output, and which varies the mean temperature in response to the modulated laser output so as to tune the single mode to correspond with the resonant wavelength.

29. Laser apparatus, comprising:

a plurality of optical elements coupled together so as to form a laser cavity resonating in a single mode, a first one of the plurality of elements having a resonant wavelength; and a thermal transfer element which is adapted to vary a temperature of at least a second one of the plurality of elements, so as to tune the single mode to correspond with the resonant wavelength, wherein the first one of the plurality of elements comprises a fiber grating.

30. A method for generating a laser output, comprising:

coupling a plurality of optical elements together so as to form a laser cavity resonating in a single mode, one of the plurality of elements having a tunable resonant wavelength;

modulating a temperature of the one of the plurality of elements about a mean temperature so as to generate a modulated laser output; and varying the mean temperature in response to the modulated laser output so as to tune the resonant wavelength to correspond with the single mode.

31. A method for generating a laser output, comprising:

coupling a plurality of optical elements together so as to form a laser cavity resonating in a single mode, one of the plurality of elements having a tunable resonant wavelength; and varying a temperature of the one of the plurality of elements so as to tune the resonant wavelength to correspond with the single mode, wherein the one of the plurality of elements comprises a fiber grating.

32. A method for generating a laser output, comprising:

coupling a plurality of optical elements together so as to form a laser cavity resonating in a single mode, a first one of the plurality of elements having a resonant wavelength; and modulating a temperature of at least a second one of the plurality of elements about a mean temperature so as to generate a modulated laser output; and varying the mean temperature in response to the modulated laser output so as to tune the single mode to correspond with the resonant wavelength.

33. A method according to claim 32, wherein the first one of the plurality of elements comprises a fiber grating.

* * * * *